US011543448B2

(12) United States Patent
Lim et al.

(10) Patent No.: US 11,543,448 B2
(45) Date of Patent: Jan. 3, 2023

(54) DYNAMICALLY DETERMINING MEASUREMENT UNCERTAINTY (MU) OF MEASUREMENT DEVICES

(71) Applicant: Keysight Technologies, Inc., Santa Rosa, CA (US)

(72) Inventors: Su Ann Lim, Penang (MY); Ghazali Bin Hussin, Pulau Pinang (MY); Hwei Liat Law, Penang (MY); Wei Zhi Ng, Penang (MY)

(73) Assignee: Keysight Technologies, Inc., Santa Rosa, CA (US)

( * ) Notice: Subject to any disclaimer, the term of this patent is extended or adjusted under 35 U.S.C. 154(b) by 1330 days.

(21) Appl. No.: 14/138,567

(22) Filed: Dec. 23, 2013

(65) Prior Publication Data

US 2015/0177315 A1    Jun. 25, 2015

(51) Int. Cl.
*G01R 31/28* (2006.01)
*G01R 21/10* (2006.01)

(52) U.S. Cl.
CPC ......... *G01R 31/2834* (2013.01); *G01R 21/10* (2013.01)

(58) Field of Classification Search
CPC ........ H04B 1/30; H04B 17/345; H04B 17/21; G01R 27/28; G01R 35/002; G01R 31/11; G01R 23/20; G06F 11/2247; G06F 1/3203; G06F 11/24; E21B 47/06; B07C 5/00; H03F 3/19; G01N 30/86; G01D 18/00; A61N 5/0613; H04H 60/32; H04L 41/22

USPC ..... 702/179, 191, 68, 181, 23, 53; 455/63.1, 455/67.13, 232.1; 175/48; 713/340; 330/127; 324/74

See application file for complete search history.

(56) References Cited

U.S. PATENT DOCUMENTS 5,524,281 A * 6/1996 Bradley ................. G01R 27/28
                                                      324/601
6,268,735 B1 * 7/2001 Craig ..................... G01R 23/20
                                                      324/601

(Continued)

FOREIGN PATENT DOCUMENTS

CN    1442704 A    9/2003
CN    1735815 A    2/2006

(Continued)

OTHER PUBLICATIONS

Chinese Office Action dated Aug. 24, 2018 with English translation, 22 pgs.

(Continued)

*Primary Examiner* — Catherine T. Rastovski
*Assistant Examiner* — Kaleria Knox

(57) ABSTRACT

A method is provided for dynamically determining measurement uncertainty (MU) of a measurement device for measuring a signal output by a device under test (DUT). The method includes storing characterized test data in a nonvolatile memory in the measurement device, the characterized test data being specific to the measurement device for a plurality of sources of uncertainty; receiving a parameter value of the DUT; measuring the signal output by the DUT and received by the measurement device; and calculating the measurement uncertainty of the measurement device for measuring the received signal using the stored characterized test data and the received parameter value of the DUT.

19 Claims, 2 Drawing Sheets

(56) References Cited

U.S. PATENT DOCUMENTS

| | | | | |
|---|---|---|---|---|
| 2005/0267716 | A1* | 12/2005 | Largey | H04B 17/345 |
| | | | | 702/191 |
| 2005/0278129 | A1* | 12/2005 | Benvenga | G06F 11/2247 |
| | | | | 702/68 |
| 2006/0223440 | A1* | 10/2006 | Stockton | H04B 1/30 |
| | | | | 455/63.1 |
| 2006/0264192 | A1* | 11/2006 | Kuo | H04B 17/21 |
| | | | | 455/232.1 |
| 2008/0125982 | A1* | 5/2008 | Yoshihiro | G01D 18/00 |
| | | | | 702/53 |
| 2008/0161957 | A1* | 7/2008 | Rice | G06F 13/385 |
| | | | | 700/108 |
| 2009/0113183 | A1* | 4/2009 | Barford | G06F 11/24 |
| | | | | 712/220 |
| 2009/0322310 | A1* | 12/2009 | Whittington | G01R 35/002 |
| | | | | 324/74 |
| 2010/0204956 | A1* | 8/2010 | Hiebel | G01R 27/28 |
| | | | | 702/179 |
| 2011/0313691 | A1* | 12/2011 | Dobson | G01R 31/11 |
| | | | | 702/58 |
| 2012/0001688 | A1* | 1/2012 | Matsuoka | H03F 3/19 |
| | | | | 330/127 |
| 2012/0065712 | A1* | 3/2012 | Rivera | A61N 5/0613 |
| | | | | 607/89 |
| 2012/0072174 | A1* | 3/2012 | Tsuru | B07C 5/00 |
| | | | | 702/181 |
| 2012/0137158 | A1* | 5/2012 | Nelluri | G06F 1/3203 |
| | | | | 713/340 |
| 2013/0018613 | A1 | 1/2013 | Chow | |
| 2013/0080073 | A1* | 3/2013 | de Corral | G01N 30/86 |
| | | | | 702/23 |
| 2013/0148519 | A1 | 6/2013 | Yu et al. | |
| 2013/0158934 | A1* | 6/2013 | Lee | H04L 41/22 |
| | | | | 702/122 |
| 2013/0215006 | A1* | 8/2013 | Liss | H04H 60/32 |
| | | | | 345/156 |
| 2014/0076632 | A1* | 3/2014 | Wessling | E21B 47/06 |
| | | | | 175/48 |
| 2014/0256268 | A1* | 9/2014 | Olgaard | H04B 17/00 |
| | | | | 455/67.13 |

FOREIGN PATENT DOCUMENTS

| | | |
|---|---|---|
| CN | 101206130 A | 6/2008 |
| CN | 101581587 A | 11/2009 |
| CN | 102043757 A | 5/2011 |
| CN | 102967838 A | 3/2013 |
| CN | 103049639 A | 4/2013 |
| CN | 103106332 A | 5/2013 |
| WO | 02099361 A1 | 12/2002 |
| WO | 2009144648 A2 | 12/2009 |

OTHER PUBLICATIONS

Chinese Search Report dated Aug. 14, 2018 with English translation, 6 pgs.

Chinese Office Action dated Apr. 23, 2019, Application No. 201410800036.8, with English translation, 25 pgs.

Notification of the Decision to Grant dated Feb. 7, 2020, with English translation, 4 pgs.

Chinese Office Action and Search Report dated Oct. 22, 2019, Application No. 201410800036.8, with English translation, 11 pgs.

* cited by examiner

DYNAMICALLY DETERMINING MEASUREMENT UNCERTAINTY (MU) OF MEASUREMENT DEVICES

BACKGROUND

When performing measurements on signals output by a device under test (DUT) using a measurement device, such as measuring power, noise and distortion characteristics, frequency response, and/or voltage of a radio frequency (RF) signal, or any other characteristics of any other electrical signals, there are many sources of measurement uncertainty (MU). When measuring power of a RF signal, for example, the largest errors are typically caused by mismatch between DUT and the measurement device. To appreciate the accuracy of such a measurement, the MU must be determined and presented along with the measured signal.

Conventional methods of calculating and obtaining MU for measurement devices are time consuming and typically performed after the actual measurement process. In other words, they do not produce results in real-time. Conventional methods include a Microsoft® Excel based MU calculator, MU software application programs, and manual calculations by hand. For example, the Microsoft® Excel based MU calculator requires manual entry of desired input parameters of the DUT in order to obtain the MU result, as well as manual generation of a new Microsoft® Excel MU calculator for each new product/model since it uses data from different customer performance specifications for calculations. Also, conventional calculators usually allow single test signal input calculation, resulting in rigid capability when dealing with multiple test points (such as a power sweep during power measurements, for example).

SUMMARY

In a representative embodiment, a method is provided for dynamically determining measurement uncertainty (MU) of a measurement device for measuring a signal output by a device under test (DUT). The method includes storing characterized test data in a nonvolatile memory in the measurement device, the characterized test data being specific to the measurement device for multiple sources of uncertainty; receiving at least one parameter value of the DUT; measuring the signal output by the DUT and received by the measurement device; and calculating the measurement uncertainty of the measurement device for measuring the received signal using the stored characterized test data and the received at least one parameter value of the DUT.

In another representative embodiment, a measurement device for measuring a signal output by a DUT includes a nonvolatile memory, a measurement module, a measurement uncertainty (MU) calculator engine, and an interface. The nonvolatile memory is configured to store characterized test data corresponding to the measurement device for multiple sources of uncertainty. The measurement module is configured to receive the signal output by the DUT and to measure the received signal. The MU calculator engine is configured to calculate measurement uncertainty of the measurement device for measuring the received signal using the stored characterized test data and a parameter value of the DUT. The interface is configured to receive the parameter value of the DUT.

In another representative embodiment, a measurement device for measuring power of a radio frequency (RF) signal output by a DUT includes a nonvolatile memory, a measurement module, an MU calculator engine, and a display. The nonvolatile memory is configured to store characterized test data corresponding to the measurement device for multiple sources of uncertainty. The measurement module is configured to measure the power of the RF signal output by the DUT. The MU calculator engine is configured to calculate measurement uncertainty of the measurement device for measuring the power using the stored characterized test data and at least one standing wave ratio (SWR) value of the DUT. The display is configured to display the measured power and the calculated measurement uncertainty, where the calculated measurement uncertainty is displayed as upper and lower limits of the measured power.

BRIEF DESCRIPTION OF THE DRAWINGS

The representative embodiments are best understood from the following detailed description when read with the accompanying drawing figures. Wherever applicable and practical, like reference numerals refer to like elements.

DETAILED DESCRIPTION

Figure 1:
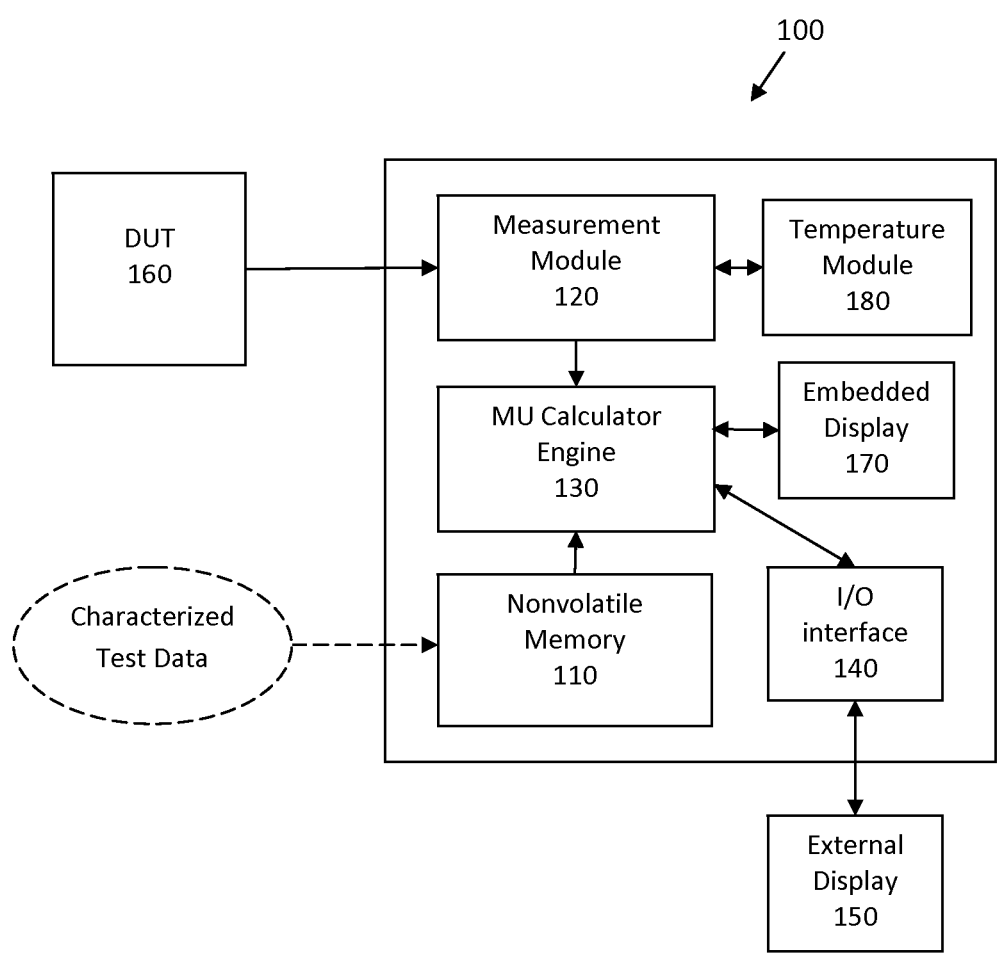
FIG. 1 is a simplified block diagram of a measurement device configured to determine measurement uncertainty (MU) in measuring signals output from a device under test (DUT), according to a representative embodiment.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As a further example, "substantially removed" means that one skilled in the art would consider the removal to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

According to various embodiments, measurement uncertainty (MU) of a measurement device is determined for measurement of a signal output by a device under test (DUT). Generally, characterized test data specific to the measurement device for a number of sources of uncertainty are determined during production, and stored in a nonvolatile memory in the measurement device at that time. Such pre-loading of characterized test data effectively translates into better accuracy in MU calculations, which is specific to the measurement device and more reflective of its true behavior, and eliminates the need to look up data on data specification sheets of the measurement device at test time to obtain values for the sources of uncertainty. Accordingly, the characterized test data does not need to be determined and/or stored later (e.g., as part of the measurement process), resulting in significant time savings.

Also, this enables minimal input of characteristics of the DUT during the measurement process. For example, if the DUT is an RF signal emitter and the measurement device is an RF power measurement device (or power sensor) that receives and measures power of the RF signal output by the DUT, the MU of the measurement device may be calculated by inputting just a standing wave ratio (SWR) value of the DUT to the measurement device at the time of measurement. The SWR value of the DUT is used to calculate correction to the power measurement (e.g., required due to mismatch gain, as discussed below). The MU of the measurement device may then be calculated with respect to the measured received signal using the stored characterized test data and relevant value(s) of the DUT (e.g., the received SWR value, when using a power measurement device), along with specifications which encompass statistical distribution spread and environmental drift contribution, for example. In another example, if the DUT is an RF signal emitter and the measurement device is measuring/analyzing noise characteristics of the RF signal, then the MU of the measurement device may be calculated by inputting the SWR value and the noise figure of the DUT. In response to a query, the measurement device indicates (e.g., displays) the measured received signal, and upper and lower limits of the measured signal corresponding to the calculated MU.

Because the characterized test data used to determine the MU is specific to the measurement device, each measurement device yields an MU result that is a true reflection of that measurement device's specific behavior and performance, which is an improvement over a conventional "one size fits all" approach when using customer performance specifications applied generally to the type of measurement device. The measurement device according to the various embodiments provide highly accurate measurement solutions as compared to conventional test and measurement instruments, as the measurements generally yield the most accurate and lowest MU.

FIG. 1 is a simplified block diagram of a measurement device configured to determine measurement uncertainty (MU) in measuring signals output from a device under test (DUT), according to a representative embodiment.

Referring to FIG. 1, measurement device 100 includes nonvolatile memory 110, measurement module 120, MU calculator engine 130, input/output interface 140, external display 150, embedded display 170 and temperature module 180. In various embodiments, the measurement device 100 may include the external display 150, the embedded display 170, or both, without departing from the scope of the present teachings. The measurement device 100 is connectable to a DUT (indicated by representative DUT 160), and is configured to receive a signal from the DUT 160. For example, in an embodiment, the signal output by the DUT may be an RF signal, which may include power sweep test points and/or frequency sweep test points. Other types of signals may be output by the DUT 160 and received by the measurement device 100, without departing from the scope of the present teachings.

The measurement device 100 is further configured to measure (sense) the received signal, and to determine the MU of the measurement device 100 in measuring characteristics of the signal output by the DUT 160, with minimal input regarding parameters of the DUT 160 and no input at measurement time of the (previously stored) characteristics of the measurement device 100. For example, in an embodiment for measuring power of a signal output by the DUT 160, the measurement device 100 receives only the standing wave ratio (SWR) value of the DUT 160 (e.g., in magnitude-phase format), which may be provided via the input/output interface 140, and outputs the measured power and the corresponding power MU to the embedded display 170 and/or to the external display 150 via the input/output interface 140 (e.g., if the user queries the measured power and corresponding power MU via Standard Commands for Programmable Instruments (SCPI) commands). In various embodiments, the measurement device 100 may include the temperature module 180, such as a thermistor, for example, which measures and monitors ambient temperature. The MU may then be calculated while accounting for ambient temperature changes. That is, as ambient temperature changes, the characterized test data which were obtained across the operating temperatures of the measurement device will be used to calculate the MU of the measurement device 100.

The measurement device 100 may be configured to perform various types of measurements, such as power (e.g., average power, peak power, and/or peak to average power ratio), noise characteristics, distortion characteristics, frequency response, and/or voltage of the measured signal, and various other electrical signals, such as AC/DC (current) and resistance, for example. Accordingly, implementations of the measurement device 100 may include a voltmeter, a signal generator and a spectrum analyzer, for example.

More particularly, during the production process of the measurement device 100, characterized test data specific to the measurement device 100 for multiple sources of uncertainty are determined and stored in the nonvolatile memory 110, as indicated by the dashed circle in FIG. 1. The nonvolatile memory 110 may be any compatible computer readable medium that retains stored data even when power is not applied. The nonvolatile memory 110 may include electrically programmable read-only memory (EPROM), electrically erasable and programmable read only memory (EEPROM), flash memory, universal serial bus (USB) flash drive, and the like, which are non-transitory (e.g., as compared to transitory propagating signals). The characterized test data stored in the nonvolatile memory 110 are generally functions of the type of signal measurements to be performed by the measurement device 100. For power measurements, for example, the characterized test data may include, but are not limited to, information regarding one or more of mismatch, power measurement linearity, zero set, zero drift, measurement noise, calibration factor, and internal calibration of the measurement device 100. Other characterized test data may include noise figure, excess noise ratio, voltage gain, AC/DC gain and/or temperature coefficients, for example, depending on the type of measurements to be performed by the measurement device 100. Processes for determining the characterized test data during the production process of the measurement device 100 would be apparent to one of ordinary skill in the art.

Referring to embodiments for measuring RF power, for purposes of illustration, mismatch indicates, in part, transmission power loss due to signal reflection (e.g., S-parameter $S_{11}$) of the measurement device 100. The power loss may be referred to as mismatch gain because an increase in power may occur, e.g., when refection coefficient terms align in phase, so mismatch gain may be positive or negative. Power measurement linearity indicates deviation from perfect linearity while performing measurements, which usually occurs at higher power ranges of the measurement device 100. Zero set is the initial setting of the measurement device 100 to "0" with no RF power applied. The zero set is usually determined by introducing an offset voltage that forces the meter to read zero, and specifying corresponding zero set error. Zero drift (or, long-term stability) indicates drift in the zero set over a relatively long period of time (e.g., one hour) for constant input power, temperature and line voltage. Measurement noise (or, short-term stability) accounts for noise from sources internal to and external from the measurement device 100. The measurement noise may be specified as the change in meter indication over a relatively short period of time (e.g., one minute) for constant input power, temperature, and line voltage. Calibration factor is the combination of measurement device mismatch loss and effective efficiency. Calibration factor uncertainties are uncertainties which arise due to calibration errors when determining calibration factor values. Internal calibration refers to corrections made to account for offset value when the measurement device is calibrated with a 1 mW reference (0 dBm) at 50 MHz power. As mentioned above, it is understood that other types of characterized test data, as would be apparent to one of ordinary skill in the art, may be preloaded in the nonvolatile memory 110 for other types of measurements, without departing from the scope of the present teachings.

Once the characterized test data for multiple sources of uncertainty are determined and stored in the nonvolatile memory 110, the measurement device 100 is ready for use. In an embodiment, the measurement device 100 is electrically connected to the DUT 160, which outputs an electrical signal, such as an RF signal. The RF signal may be responsive to a stimulus signal input to the DUT 160 by an RF signal generator (not shown), or the DUT 160 may generate the signal itself (e.g., when the DUT 160 is an RF signal generator). Of course, in various embodiments, the measurement device 100 may be configured to measure various types of electrical signals other than RF signals, and/or to receive signals from devices other than a DUT, without departing from the scope of the present teaches.

In embodiments for measuring power, for example, the measurement module 120 receives an RF signal and measures corresponding RF power, such as average power, peak power and/or peak to average power ratio, for example. The measurement module 120 may include any of a variety of types of sensors, such as a thermistor sensor, a thermocouple sensor or a diode sensor, for example. For non-thermistor type measurement instruments, a thermistor may be embedded into the measurement module 120 for ambient temperature monitoring or as a separate temperature module 180, and the temperature data acquired from the thermistor is used as part of the data input for MU calculation over temperature changes. The measurement module 120 may also include additional circuitry for measuring the power of the RF signal, such as amplifiers and filters, as would be apparent to one of ordinary skill in the art, depending on the particular requirements of the DUT 160 and/or the measurement device 100. The MU calculator engine 130 may output the measured RF power and corresponding calculated MU to the embedded display 170 and/or to the external display 150.

In various embodiments, the embedded display 170 and/or the external display 150 may be a visual representation of the measured RF power and calculated MU measured device, such as digital numbers or an analog gauge.

In various alternative embodiments, the measurement device 100 may be connected to a computer, such as a personal computer (PC), through a compatible interface, such as a universal serial bus (USB) interface or a general purpose interface bus (GPIB)-USB/local area network (LAN) interface, for example. In this case, the display (e.g., external display 150) may be a computer screen or other display controlled by a graphical user interface (GUI). For example, a PC may run a Microsoft Windows® compatible software application that interfaces with the measurement device 100 in real-time, when the measurement device 100 is connected to the PC via a USB cable. For RF Power embodiments, the RF power may be measured and/or displayed in decibels (dB) or Watts, for example, as selected by the user.

In RF power measurement embodiments, for example, the MU calculator engine 130 is configured to calculate the power MU of the measurement device 100 for measuring the power of the received RF signal. The MU calculator engine 130 dynamically calculates the power MU using the characterized test data of the measurement device 100 previously determined and stored in the nonvolatile memory 110 (as discussed above) and the SWR value of the DUT 160, as well as current settings of the measurement device 100, such as current measured frequency and measurement average count, and specifications that encompass statistical distribution spread and environment drift. For example, in an embodiment, the MU calculator engine 130 may use probability distributions in accordance with the ISO Guide to the Expression of Uncertainty in Measurement (GUM). No other information regarding characteristics of the DUT 160 is needed for the power MU determination. The power MU thus can be obtained across various power levels and temperatures.

Generally, for MU, the SWR of the DUT 160 is a parameter that is used to calculate the source of measurement uncertainty and/or the contributor of measurement uncertainty, which in the case of RF power measurement, for example, is mismatch between the DUT 160 and measurement device 100. In other embodiments, the SWR may also include mismatch between the DUT 160 and a calibrator source of the measurement device 100, as well.

Referring to embodiments for measuring RF power, for purposes of illustration, the SWR value of the DUT 160 may be entered by a variety of means, without departing from the scope of the present teachings, including manually by the user through the input/output interface 140, or through a computer. For example, the SWR value of the DUT may be a single point gamma value entered by the user using one or more SCPI commands, such as [SENSe[1]:]CORRection:SGAMma:MAGNitude, via the input/output interface 140. The MU calculator engine 130 receives the SCPI command, extracts the entered SWR value, and applies the SWR value across all frequencies of the RF signal being measured in determining the power MU Alternatively for RF power embodiments, a table associated with the DUT 160 may be provided, where the table includes table-based gamma values of SWRs of the DUT 160 and corresponding frequencies of the RF signal. The MU calculator engine 130 may then automatically determine the SWR of the DUT 160 given the frequency of the received RF signal (e.g., provided by the measurement module 120 or entered by the user). In SCPI format, the table-based commands include MEMory:TABLe:SGAMma <magnitude1, phase1,magnitude2,phase2 . . . magnitudeN, phaseN>, where a list of magnitude-phase pairs are entered for a list of user desired frequency values, which may be entered using MEMory:TABLe:FREQuency. The frequency list and magnitude-phase pairs list may be saved and stored into a memory (e.g., the nonvolatile memory 110) of the measurement device 100 as a named table of values.

Also, for example, in RF Power embodiments, the DUT 160 may be connected to a network analyzer (not shown) that outputs a Service Pack (e.g., S2P file) containing the SWR values of the DUT 160 and corresponding frequencies of the RF signal. The MU calculator engine 130 receives the .S2P file via user entry using SCPI, and is then able to automatically determine the SWR of the DUT 160 to be used in MU calculation based on the user desired frequency of the received RF signal, e.g., where the desired frequency is input by the user as part of typical current settings of the measurement device 100. For S-parameter .S2P file selection of SWR input, for example, the user may input an .S2P file of data into the measurement device 100 using the SCPI command MEMory: TABLe:SPAR S11|S12|S21|S22. Of course, other programming formats and/or other SCPI commands for providing SWR value(s), or any other user input parameter values for calculation of MU, may be incorporated without departing from the scope of the present teachings.

In embodiments for measuring RF power, the MU calculator engine 130 is further configured to output the measured RF power and calculated power MU in response to a query requesting the information. For example, a SCPI command for querying measured RF power and associated power MU may include one of FETCh[1][[:SCALar]:POWer:AC]: MUNC? [<expected value>[,<resolution>[,<source list>]]], READ[1] [:SCALar][:POWer:AC]:MUNC, or MEASure[1] [:SCALar] [:POWer:AC]:MUNC, received by the MU calculator engine 130 via the input/output interface 140. Accordingly, the power MU may be displayed, along with the measured power of the received RF signal, as an upper limit and a lower limit of the measured power in response to the query. For example, the power MU is determined and displayed (e.g., via embedded display 170 and/or external display 150) in ±dB when the measured power is in dBm, and ±percentage when the measured power is in Watts. The MU calculator engine 130 is thus configured to calculate the power measurement uncertainty of the measurement device 100 in real time. Because the power MU calculations are performed by resident firmware or software, etc., of the MU calculator engine 130, the measurement device 100 may be portable as it has no need for a separate calculator, for example, in the form of a software application and/or Microsoft® Excel running on a PC. Of course, other programming formats and/or other SCPI commands for requesting measured RF power and associated power MU, or any other output parameters of MU, may be incorporated without departing from the scope of the present teachings.

The MU calculator engine 130 may be implemented by a computer processor, application specific integrated circuits (ASICs), field-programmable gate arrays (FPGAs), or combinations thereof, using firmware, software, hard-wired logic circuits, or combinations thereof. When using a computer processor, a memory may be included for storing executable firmware/software and/or executable code that allows it to perform the various functions. The memory may include any number, type and combination of random access memory (RAM) and read-only memory (ROM), for example. The type, number and arrangement of interfaces may vary without departing from the scope of the present teachings.

As mentioned above, rather than directly communicating with the measurement device 100 and/or the MU calculator engine 130 using SCPI commands, the user may use a software application (e.g., MS-Windows compatible) running on a PC or other computer to interface with the measurement device 100 (e.g., in real-time) when the measurement device 100 is connected to the PC via a USB cable, for example. Examples of such PC software applications include Agilent IO Libraries Suite and N1918A Power Analysis Manager and Power Panel Software, available from Agilent Technologies, Inc. Accordingly, in RF Power embodiments, for example, the user is able to enter SWR values and/or choose the source of the SWR values, e.g., single point gamma value, table-based gamma value, or .S2P file provided value, via a GUI of the PC software application. For RF power embodiments, the PC software application likewise may display the measured RF power and associated power MU calculated by the MU calculator engine 130 (e.g., in real-time), while the measurement device 100 is in use, in response to requests for this information by the user. Display of the measured power is in dBm or Watts with associated power MU in ±dB or ±percentage of Watts, respectively. The corresponding display may take various forms, such as numerical form, plotted trace graph of values, or the like.

Figure 2:
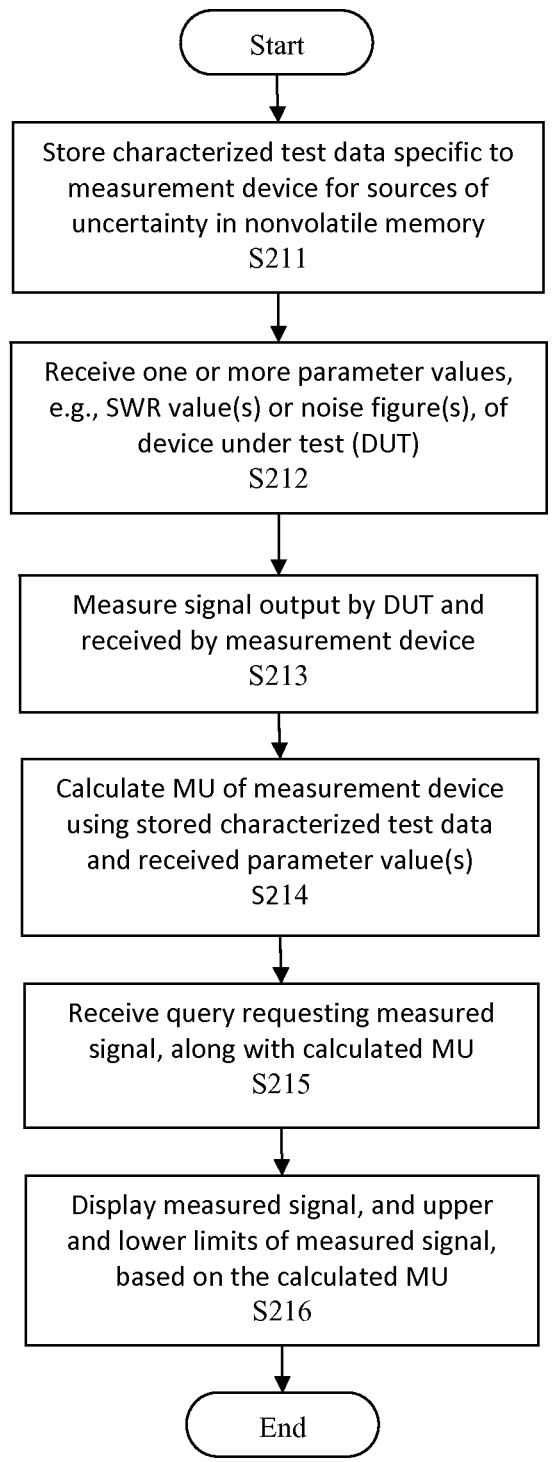
FIG. 2 is a flow diagram depicting a method for determining MU of a measurement device for measuring signals output from a DUT, according to a representative embodiment.

FIG. 2 is a flow diagram depicting a method for determining MU of a measurement device for measuring output signal of a DUT, according to a representative embodiment. For example, the depicted method is may be directed to measuring RF power of an RF signal output by the DUT and corresponding power MU of the measurement device, or measuring noise characteristics of the DUT and corresponding noise MU of the measurement device. However, it is understood that method may generally apply to determining MU corresponding to other types of signals and/or signal measurements, without departing from the scope of the present teachings.

Referring to FIG. 2, in block S211, characterized test data specific to the measurement device 100 for one or more sources of uncertainty are stored in nonvolatile memory 110 of the measurement device 100. For example, when measuring RF power, the characterized test data may include, but are not limited to, information regarding mismatch, power measurement linearity, zero set, zero drift, measurement noise, calibration factor uncertainties, and/or internal calibration of the measurement device 100, as discussed above. The characterized test data is determined by specific testing of the measurement device 100 during the production process.

After storing the characterized test data, the measurement device 100 is ready for use. For example, the measurement device 100 may be electrically connected to DUT 160 to measure RF power (e.g., average power, peak power and/or peak to average power ratio) of RF signals output by the DUT 160 during testing. In block S212, at least one parameter value of the DUT, such as one or more SWR values and/or noise figures, in the case of RF power or noise characteristic measurements, are received by the measurement device 100. The SWR values may be single point values, table-based values, or S-parameters (Scattering Parameters) values in an .S2P file (Touchstone format), for example. In an embodiment, no other characteristics of the DUT 160 need be entered to perform the RF power measurement and power MU calculation. As discussed above, the SWR values may be entered directly in the measurement device 100, e.g., using SCPI commands, or indirectly, e.g., using a software application running on a PC or other computer connected to the measurement device 100 via a USB cable.

The signal output by the DUT 160 is received by the measurement device 100, and measured (sensed) in block S213. In addition, the MU of the measurement device 100 for measuring the received signal is calculated in block S214 using the previously stored characterized test data and the received parameter value(s) (e.g. SWR value(s) for RF power measurement embodiment, and SWR value(s) and noise figure(s) for noise characteristic measurement embodiment). Calculation of the MU further incorporates current settings of the measurement device 100 and probability distributions in accordance with the ISO Guide to the Expression of Uncertainty in Measurement (GUM), as would be apparent to one of ordinary skill in the art. Calculating the MU may be performed in real time by the MU calculator engine 130 in the measurement device 100, which may be implemented using software, firmware, hard-wired logic circuits, or combinations thereof.

In block S215, a query is received at the measurement device 100 requesting the measured signal, along with the MU of the measurement device 100. In response to the query, the measured signal, and the upper and lower limits of the measured signal based on the calculated MU, are indicated, e.g., by display, in block S216. The query may be entered directly in the measurement device 100, e.g., using SCPI commands, or indirectly, e.g., using a software application running on a PC or other computer connected to the measurement device 100 via a USB cable, for example. Also, indicating the measured signal and the upper and lower limits of the measured signal due to MU may be performed in real time in response to the query. When measuring RF power in particular, the measured power may be indicated in dBm, and the upper and lower limits may be indicated in +dB and −dB relative to the measured power. Alternatively, the measured power may be indicated in Watts, and the upper and lower limits may be indicated in +percentage and −percentage of Watts relative to the measured power. The use of decibels or Watts may be selectable by the user, for example.

Various operations depicted in FIG. 2 may be stored on a non-transitory computer readable medium and/or executed by one or more processing devices, such as the MU calculator engine 130, as discussed above. That is, the MU calculator engine 130 is configured to execute one or more logical or mathematical algorithms, including the MU calculation process of the embodiments described herein, in conjunction with the nonvolatile memory 110.

In accordance with illustrative embodiments, a measurement device configured to determine measurement uncertainty (MU) for measuring signals from a DUT and a method of determining the same are described. The embodiments are more efficient than conventional techniques, eliminating the need to manually enter characterized test data of the measurement device at test time, and reducing the need to enter DUT input parameter values (e.g., entering only SWR for RF power measurements). Also, the embodiments eliminate the need to generate a new calculator each time a new product/model is released. The embodiments directed to measuring RF power, in particular, also provide the ability to handle power and frequency sweep test points, and generally provide improved accuracy with regard to the power MU.

One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

What is claimed is:

1. A method of dynamically determining measurement uncertainty (MU) of a measurement device, the method comprising:
   determining characterized test data by testing the measurement device during production of the measurement device, and preloading the characterized test data in a nonvolatile memory in the measurement device during the production of the measurement device;
   receiving at least one parameter value of a device under test (DUT) at the measurement device;
   receiving a signal output by the DUT at the measurement device different from the received at least one parameter value, and measuring the received signal;
   calculating the measurement uncertainty of the measurement device for measuring the received signal using the characterized test data and the received at least one parameter value of the DUT, the characterized test data being unique to the measurement device for a plurality of sources of uncertainty; and
   indicating upper and lower limits of the measured signal corresponding to the calculated measurement uncertainty.

2. The method of claim 1, further comprising:
   receiving a query requesting the measurement uncertainty; and
   indicating the measured signal with the upper and lower limits of the measured signal corresponding to the calculated measurement uncertainty in response to the query.

3. The method of claim 1, wherein measuring the signal received by the measurement device comprises measuring power of the signal, and
   wherein receiving the at least one parameter value of the DUT at the measurement device comprises receiving a standing wave ratio (SWR) value of the DUT.

4. The method of claim 2, wherein measuring the signal received by the measurement device comprises measuring noise characteristics of the signal, and
   wherein receiving the at least one parameter value of the DUT comprises receiving a standing wave ratio (SWR) value and a noise figure of the DUT.

5. The method of claim 2, wherein measuring the signal received by the measurement device comprises measuring one of frequency response, voltage or distortion characteristics of the signal.

6. The method of claim 3, wherein the SWR value of the DUT and a query requesting the measurement uncertainty are provided using corresponding Standard Commands for Programmable Instruments (SCPI) commands.

7. The method of claim 1, wherein calculating the measurement uncertainty is performed in real time by the measurement device.

8. The method of claim 7, wherein calculating the measurement uncertainty comprises using current settings of the measurement device and probability distributions in accordance with ISO Guide to the Expression of Uncertainty in Measurement (GUM).

9. The method of claim 2, wherein indicating the measured signal and the upper and lower limits of the measured signal comprises displaying the measured signal and the upper and lower limits of the measured signal in real time.

10. The method of claim 3, further comprising:
indicating the measured power, and upper and lower limits of the measured power corresponding to the calculated measurement uncertainty, in response to a query,
wherein, when the measured power is indicated in dBm, the upper limit is indicated in +dB and the lower limit is indicated in —dB relative to the measured power, and when the measured power is indicated in Watts, the upper limit is indicated in +percentage Watts and the lower limit is indicated in — percentage Watts relative to the measured power.

11. The method of claim 1, wherein the characterized test data for the sources of uncertainty include mismatch, power measurement linearity of the measurement device, zero drift, calibration factor uncertainties of the measurement device, measurement noise, zero set, and internal calibration of the measurement device.

12. A measurement device for dynamically measuring a signal output by a device under test (DUT), the measurement device comprising:
a nonvolatile memory configured to store, during production of the measurement device, characterized test data unique to the measurement device for a plurality of sources of uncertainty, the characterized test data being determined by testing the measurement device during the production of the measurement device;
a measurement module configured to receive the signal output by the DUT and to measure the received signal;
a measurement uncertainty (MU) calculator engine configured to calculate measurement uncertainty of the measurement device, in real time, for measuring the received signal using the stored characterized test data and a parameter value of the DUT different from the measured received signal;
an interface configured to receive the parameter value of the DUT; and
a display configured to indicate upper and lower limits of the measured signal corresponding to the calculated measurement uncertainty.

13. The measurement device of claim 12, further comprising:
a temperature module configured to measure and monitor ambient temperature, wherein the MU calculator engine is further configured to calculate the MU of the measurement device accounting for changes in ambient temperature indicated by the temperature module.

14. The measurement device of claim 12, wherein the interface is further configured to receive a query requesting the measured signal and the measurement uncertainty, and the display being configured to enable display of the measured signal, and the upper and lower limits of the measured signal in response to the query.

15. The measurement device of claim 12, wherein the received signal comprises an RF signal output by the DUT, and the measurement module is configured to measure power of the RF signal, and
wherein the parameter value of the DUT comprises a standing wave ratio (SWR) value of the DUT.

16. The measurement device of claim 15, wherein the SWR value of the DUT and a query requesting the measurement uncertainty are input using corresponding Standard Commands for Programmable Instruments (SCPI) commands.

17. The measurement device of claim 12, wherein the received signal comprises an RF signal output by the DUT, and the measurement module is configured to measure noise characteristics of the RF signal, and
wherein the parameter value of the DUT comprises a standing wave ratio (SWR) value of the DUT and a noise figure of the DUT.

18. A measurement device for measuring power of a radio frequency (RF) signal output by a device under test (DUT) and received by the measurement device, the measurement device comprising:
a nonvolatile memory configured to store, during production of the measurement device, characterized test data unique to the measurement device for a plurality of sources of uncertainty, the characterized test data being determined by testing the measurement device during at least one of calibration and the production of the measurement device;
a measurement module configured to measure the power of the received RF signal output by the DUT;
a measurement uncertainty (MU) calculator engine configured to calculate measurement uncertainty of the measurement device for measuring the power using the stored characterized test data and at least one standing wave ratio (SWR) value of the DUT; and
a display configured to display the measured power and the calculated measurement uncertainty, wherein the calculated measurement uncertainty is displayed as upper and lower limits of the measured power.

19. The measurement device of claim 18, wherein the power measured by the measurement module comprises at least one of average power, peak power and peak to average power ratio.

* * * * *